United States Patent

Yamada et al.

[11] Patent Number: 5,982,040
[45] Date of Patent: Nov. 9, 1999

[54] SEMICONDUCTOR DEVICE AND METHOD FOR MANUFACTURING THE SAME

[75] Inventors: Masaki Yamada, Kawasaki; Minakshisundaran Balasubramanian Anand; Hideki Shibata, both of Yokohama, all of Japan

[73] Assignee: Kabushiki Kaisha Toshiba, Kawasaki, Japan

[21] Appl. No.: 08/970,199

[22] Filed: Nov. 14, 1997

[30] Foreign Application Priority Data

Nov. 18, 1996 [JP] Japan .................................. 8-306267

[51] Int. Cl.⁶ .......................... H01L 23/48; H01L 23/52; H01L 29/40
[52] U.S. Cl. .......................... 257/776; 257/752; 257/758; 257/771
[58] Field of Search .................... 257/752, 758, 257/771, 774, 765, 776; 438/624–626, 688

[56] References Cited

U.S. PATENT DOCUMENTS

| 4,617,193 | 10/1986 | Wu ........................................ 257/750 |
| 5,294,837 | 3/1994 | Takase et al. ............................ 257/774 |
| 5,327,011 | 7/1994 | Iwamatsu ................................ 257/750 |
| 5,726,499 | 3/1998 | Irinoda .................................... 257/774 |

FOREIGN PATENT DOCUMENTS

| 60-38837 | 2/1985 | Japan .................................... 257/758 |
| 62-57234 | 3/1987 | Japan .................................... 257/758 |
| 4-27151 | 1/1992 | Japan .................................... 257/758 |
| 4-207053 | 7/1992 | Japan .................................... 257/758 |

*Primary Examiner*—Mahshid Saadat
*Assistant Examiner*—Jhihan B Clark
*Attorney, Agent, or Firm*—Finnegan, Henderson, Farabow, Garrett & Dunner, L.L.P.

[57] ABSTRACT

A semiconductor device includes a semiconductor substrate having a main surface, and a multi-layered wiring layer formed on the main surface of the semiconductor substrate, the multi-layered wiring layer having a plurality of wiring layers insulatively laminated, wherein the melting points of the plurality of wiring layers are set gradually lower in a direction towards the higher-level side.

5 Claims, 3 Drawing Sheets

| Al ALLOY | EUTECTIC POINT (°C) | MIXING RATIO (wt%) | SOLID SOLUBILITY (wt%) | RESISTANCE CHANGE | EXPECTED IMPROVEMENT |
|---|---|---|---|---|---|
| Al | 660 | 0 | 100 | NONE | |
| Al-Ca | 617 | 7.6 | 0.01 | ALMOST NONE | |
| Al-Li | 600 | 9.9 | 4 | INCREASED | |
| Al-Si | 577 | 12.5 | 1.65 | INCREASED | |
| Al-Ag | 566 | 70 | 55.6 | INCREASED | ELECTROMIGRATION RESISTANCE |
| Al-Cu | 547 | 33.2 | 5.65 | INCREASED | ELECTROMIGRATION RESISTANCE |
| Al-Mg | 450 | 35 | 17.4 | INCREASED | ELECTROMIGRATION & CORROSION RESISTANCE |
| Al-Ge | 424 | 54 | 5.2 | INCREASED | |
| Al-Zn | 382 | 94.9 | 69.5 | INCREASED | |
| Al-Pb | 326 | 99.9 | 0.2 | ALMOST NONE | CORROSION RESISTANCE |
| Al-Bi | 271 | 98.1 | 0.2 | ALMOST NONE | CORROSION RESISTANCE |
| Al-Sn | 228 | 99.5 | 0.1 | ALMOST NONE | CORROSION RESISTANCE |
| Al-In | 156 | 99 | 0.17 | ALMOST NONE | CORROSION RESISTANCE |
| Al-Ga | 26 | 99 | 20 | ALMOST NONE | CORROSION RESISTANCE |

FIG. 3

| Al ALLOY | Ga CONCENTRATION (wt%) | MELTING POINT |
|---|---|---|
| Al-Ga | 0 | 660 |
| Al-Ga | 5 | 648 |
| Al-Ga | 10 | 638 |
| Al-Ga | 15 | 628 |
| Al-Ga | 20 | 613 |

FIG. 4

SEMICONDUCTOR DEVICE AND METHOD FOR MANUFACTURING THE SAME

BACKGROUND OF THE INVENTION

This invention relates to a semiconductor device and a method for manufacturing the same, and more particularly to a semiconductor device having a multi-layered wiring structure and a method for manufacturing the same.

Recently, various types of LSIs are used in the main portions of computers and communication devices and the performances of the computers and communication devices are closely related to the performance of the LSI itself. The performance of the LSI itself can be improved by enhancing the integration density thereof, that is, reducing the size of elements.

Since the aspect ratio of the contact hole increases as the size of the element is reduced, it is difficult to form a continuous conductive layer in a plug because of breakage of a wiring metal in the plug, that is, breakage of the wiring metal at a stepped portion when the wiring metal is formed by the conventional sputtering method. Therefore, a method for embedding tungsten in the plug and forming a wiring metal (an aluminum alloy in most cases) thereon is used. However, with this method, since a metal embedded in the plug and a wiring metal are different from each other, there occur problems that the reliability is lowered, different tools are required for embedding the metal into the plug and forming the wiring metal and the number of steps is increased.

In order to solve the above problems, the reflow technique for simultaneously forming the plug and the wiring metal is studied. The reflow technique is a technique for causing a metal to flow by use of the high-temperature sputtering method or the like, but most of the reflow techniques now studied are to form stacked several wiring layers at the same reflow temperature.

When the metal wirings of several layers are formed at the same reflow temperature by use of the reflow technique, the metal wiring of the underlying layer is subjected to the same heat treatment several times and a void occurs therein to lower the reliability of the wiring.

BRIEF SUMMARY OF THE INVENTION

An object of this invention is to provide a semiconductor device having a multi-layered wiring structure and capable of preventing the lowering in the reliability of the wiring due to occurrence of void or the like and a method for manufacturing the same.

In order to attain the above object, a semiconductor device of this invention comprises a semiconductor substrate having a main surface; and a multi-layered wiring layer formed on the main surface of the semiconductor substrate, the multi-layered wiring layer including a plurality of wiring layers insulatively laminated; wherein a melting point of each of the plurality of wiring layers is set lower than that of one of the wiring layers which lies at a lower level.

It is preferable that each of the wiring layers constructing the multi-layered wiring layer is formed of the same base metal and the melting point of each of the plurality of wiring layers is set lower than that of one of the wiring layers which lies at a lower level by introducing a doping element into the base metal in at least one of the wiring layers.

Each of the wiring layers constructing the multi-layered wiring layer can be formed of the same base metal and the melting point of each of the plurality of wiring layers can be set lower than that of one of the wiring layers which lies at a lower level by introducing different types of doping elements into the base metal in at least two layers among the wiring layers.

It is also possible to form each of the wiring layers constructing the multi-layered wiring layer by use of the same base metal and set the melting point of each of the plurality of wiring layers lower than that of one of the wiring layers which lies at a lower level by introducing a doping element at different concentrations into the base metal in at least two layers among the wiring layers.

It is preferable that each of the plurality of wiring layers is formed in a corresponding one of concave portions formed in a plurality of insulating films laminated on an upper surface side of the semiconductor substrate.

It is preferable that the base metal is aluminum.

According to the above semiconductor device, since each of the wiring layers constructing the multi-layered wiring layer is formed of a wiring material whose melting point is set lower than that of a lower-level layer thereof, the film formation temperatures of the wiring layers can be set gradually lower in a direction from the lower-level side to the higher-level side. Therefore, an influence exerted on the lower-level wiring layer in the heat treatment when the higher-level wiring layer is formed can be reduced and a wiring structure with high reliability in which occurrence of void is suppressed can be attained. Further, occurrence of void can be suppressed by forming the wiring layers by use of the wiring material of the same base metal and a wiring structure with high reliability can be attained.

Further, as the above insulating film, an organic material of small permittivity can be used instead of an inorganic material. Generally, the heat resistance of the organic material is low, but in the above semiconductor device, since the wiring layer on the higher-level side can be formed at a relatively low temperature, it is possible to use an organic material of low heat resistance.

A method for manufacturing a semiconductor device according to this invention comprises the steps of forming an insulating layer on a main surface of a semiconductor substrate; forming a wiring layer on the insulating layer; and repeatedly effecting the step of forming the insulating layer and the step of forming the wiring layer by a preset number of times to form a multi-layered wiring layer having a plurality of wiring layers with the wiring layer used as one unit layer; wherein a melting point of a wiring material of each of the plurality of wiring layers is set lower than that of one of the wiring layers which lies at a lower level and a film formation temperatures of the plurality of wiring layers are set gradually lower in a direction from a low-level side to a high-level side.

In the step of forming the wiring layer, it is preferable that the same base metal is used for the wiring material of each of the plurality of wiring layers, the melting point of the wiring material of each of the plurality of wiring layers is set lower than that of one of the wiring layers which lies at a lower level by introducing a doping element into the base metal in at least one of the wiring layers, and the film formation temperatures of the plurality of wiring layers are set gradually lower in a direction from the low-level side to the high-level side.

Further, in the step of forming the wiring layer, the same base metal can be used for the wiring material of each of the plurality of wiring layers, the melting point of the wiring material can be set lower than that of one of the wiring layers which lies at a lower level by introducing different types of doping elements into the base metal in at least two layers among the wiring layers, and the film formation temperatures of the plurality of wiring layers may be set gradually lower in a direction from the low-level side to the high-level side.

Further, in the step of forming the wiring layer, the same base metal can be used for the wiring material of each of the plurality of wiring layers, the melting point of the wiring material can be set lower than that of one of the wiring layers which lies at a lower level by introducing a doping element at different concentrations into the base metal in at least two layers among the wiring layers, and the film formation temperatures of the plurality of wiring layers may be set gradually lower in a direction from the low-level side to the high-level side.

The step of forming the wiring layer may include a step of effecting a sputtering process by use of a target formed by introducing the doping element into the base metal.

The step of forming the wiring layer may include a step of sputtering the base metal in a gas atmosphere containing the doping element.

The step of forming the wiring layer may include a step of sputtering the base metal while heating the semiconductor substrate, after forming a laminated film formed of a film of the base metal and a film of the doping element, whereby the wiring layer may be formed of the base metal having the doping element contained therein.

It is preferable that the step of forming the insulating layer includes a step of forming an insulating layer having a plurality of concave portions formed therein, and the step of forming the wiring layer includes a step of embedding a wiring material into the plurality of concave portions of the insulating layer to form wiring layers.

According to the above manufacturing method, since the melting point of the wiring material of each of the wiring layers constructing the multi-layered wiring layer is set lower than a lower-level one of the wiring layers and the film formation temperatures of the wiring layers are set gradually lower in a direction from the low-level side to the high-level side, an influence exerted on the lower-level wiring layer in the heat treatment when the higher-level wiring layer is formed can be reduced. Therefore, occurrence of void can be suppressed and a wiring structure with high reliability can be attained. Further, occurrence of void can be suppressed at connecting portions between the wiring layers by forming the wiring layers by use of the wiring material of the same base metal and a wiring structure with high reliability can be attained.

Further, as the above insulating film, an organic material of small permittivity can be used instead of an inorganic material. Generally, the heat resistance of the organic material is low, but in the above semiconductor device, since the wiring layer on the higher-level side can be formed at a relatively low temperature, it is possible to use an organic material of low heat resistance.

Further, the step of forming the wiring layer in the concave portions of the insulating film may include a step of forming a first alloy film formed by introducing the doping element into the base metal in the concave portions and on the insulating film, a step of forming a second alloy film formed of the base metal and doping element while the first alloy film is kept in the fluidized state by sputtering the base metal in a gas atmosphere containing the doping element while the temperature of the semiconductor substrate is kept higher than the temperature at which the first alloy film is formed, and a step of filling the second alloy film in the concave portions.

Alternatively, the step of forming the wiring layer in the concave portions of the insulating film may include a step of forming a laminated film formed of a film of the base metal and a film of the doping element in the concave portions and on the insulating film, a step of forming an alloy film formed of the base metal and doping element while the laminated film is kept in the fluidized state by sputtering the base metal while the temperature of the semiconductor substrate is kept higher than the temperature at which the laminated film is formed, and a step of filling the second alloy film in the concave portions.

Alternatively, the step of forming the wiring layer in the concave portions of the insulating film may include a step of adhering the base metal and doping element which are kept in the fluidized state to portions in the concave portions and on the insulating film to form an alloy film formed of the base metal and doping element by effecting a sputtering process by use of a target formed by introducing the doping element into the base metal with the temperature of the semiconductor substrate kept high, and a step of filling the alloy film in the concave portions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a diagram showing a eutectic point, etc when the type of an element introduced into aluminum is changed; and FIG. 4 is a diagram showing a melting point when the concentration of an element introduced into aluminum is changed.

DETAILED DESCRIPTION OF THE INVENTION

Before explaining the embodiments of this invention, first, alloys formed by doping different types of elements or elements of different concentrations into a metal are considered and the melting point (eutectic point) of the alloy in relation to the type of the doping element and the concentration of the doping element is explained.

FIG. 3 shows the eutectic point (the eutectic point and the melting point can be considered to be substantially correlative to each other) set when Al is used as a base metal and various types of elements are doped in the base metal. The mixing ratio the doping element to eutectic mixture of Al, the solid solubility thereof, the degree of a variation (increase) in the resistance of the Al alloy caused by addition of the element, and the effect expected to be attained by addition of the element are also shown. Thus, it is understood that the eutectic point of the Al alloy varies according to the types of the doping elements.

FIG. 4 shows the melting point in a case where Al is used as a base metal and Ga is doped as the doping element in the base metal. Thus, it is understood that the eutectic point of the Al alloy also varies according to the concentration of the doping element.

There will now be described each of the embodiments of this invention with reference to the accompanying drawings.

(First Embodiment)

First, the first embodiment is explained with reference to the manufacturing process of an integrated circuit using MOS transistors shown in FIGS. 1A to 1G.

Figure 1A:
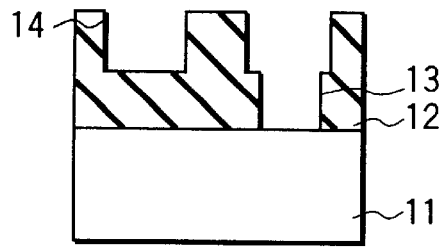
FIGS. 1A to 1G are views sequentially showing the steps of each of manufacturing methods according to first to fourth embodiments of this invention.

First, a first-level interlaid insulating film 12 using a silicon oxide film or the like is deposited on a silicon substrate 11 by the CVD method. Then, a connection hole 13 for connection to an element region and a wiring groove 14 used for embedding a wiring material are formed in the interlaid insulating film 12 by use of the photolithography and dry etching process (FIG. 1A).

Next, a metal alloy film 15b is formed on the interlaid insulating film 12 and in the connection hole 13 and wiring groove 14 by the following two sequential steps. In this case, aluminum is used as the base metal of the alloy and silicon is used as the doping element.

Figure 1B:
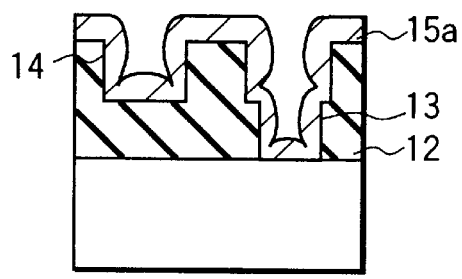

First, an Al—Si alloy film target is placed in a sputtering device, and the sputtering process is effected in a non-heated state to form an Al—Si alloy film 15a with a film thickness of approximately 400 nm (FIG. 1B).

Figure 1C:
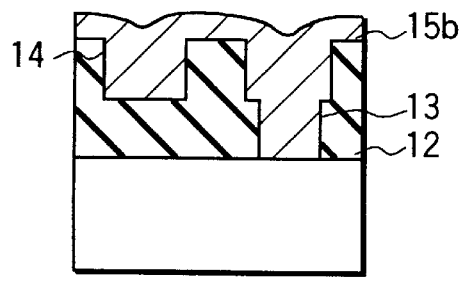

Then, the substrate temperature is set to 500° C. and the sputtering process is effected by use of the same Al—Si alloy film target as that used in the previous step to form an Al—Si alloy film 15b with a total film thickness of approximately 800 nm. Since the sputtering process is effected with the substrate set in the heated state, the Al—Si alloy is set into a fluidized state and the connection hole 13 and wiring groove 14 are completely filled with the Al—Si alloy film 15b (FIG. 1C).

Figure 1D:
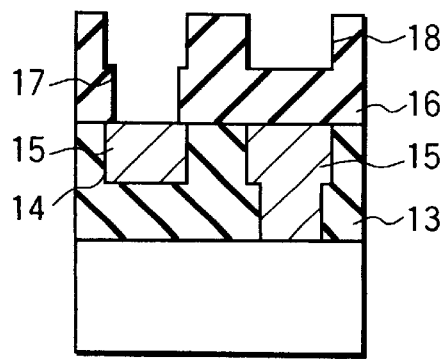

Next, the entire surface of the resultant structure is subjected to the chemical-mechanical polishing process (CMP process) so as to leave the Al—Si alloy film 15 only in the connection hole 13 and wiring groove 14 and thus a first-level wiring layer is formed. Then, a second-level interlaid insulating film 16 using a silicon oxide film or the like is deposited on the resultant structure by the CVD method. After this, a connection hole 17 connected to the alloy film 15 (wiring layer) and a wiring groove 18 used for embedding the wiring material of a second-level wiring layer are formed in the interlaid insulating film 16 by use of the photolithography and dry etching process (FIG. 1D).

Next, a metal alloy film 19b is formed on the interlaid insulating film 16 and in the connection hole 17 and wiring groove 18 by the following two sequential steps. As the alloy film 19b formed at this stage, a film whose eutectic point is lower than that of the previously formed alloy film 15b is selected. In this case, aluminum is used as the base metal of the alloy and copper is used as the doping element.

Figure 1E:
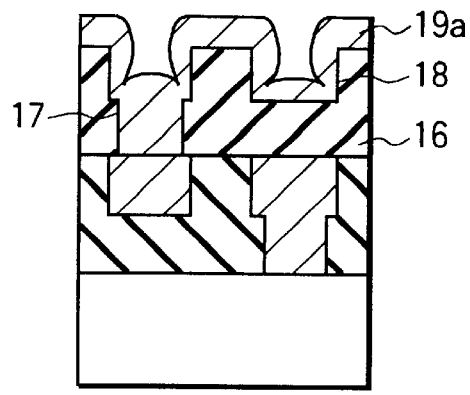

First, an Al—Cu alloy film target is placed in the sputtering device, and the sputtering process is effected in a non-heated state to form an Al—Cu alloy film 19a with a film thickness of approximately 400 nm (FIG. 1E).

Figure 1F:
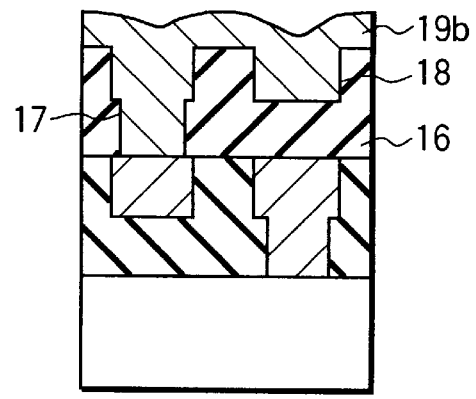

Next, the substrate temperature is set to 460° C., that is, a temperature which is lower than the substrate temperature 500° C. set in the previous step and the sputtering process is effected by use of the same Al—Cu alloy film target as that used in the previous step to form an Al—Cu alloy film 19b with a total film thickness of approximately 800 nm. Since the sputtering process is effected with the substrate set in the heated state, the Al—Cu alloy is set into a fluidized state and the connection hole 17 and wiring groove 18 are completely filled with the Al—Cu alloy film 19b (FIG. 1F).

Figure 1G:
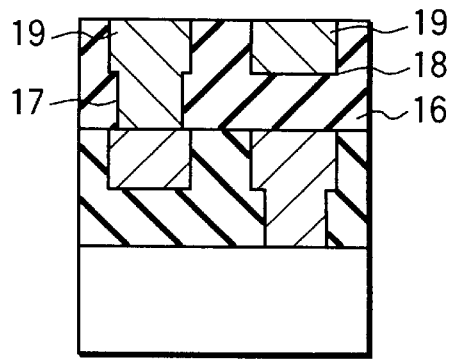
Figure 2A:
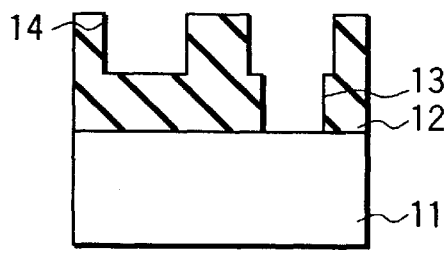
FIGS. 2A to 2G are views sequentially showing the steps of each of manufacturing methods according to fifth and sixth embodiments of this invention.
Figure 2B:
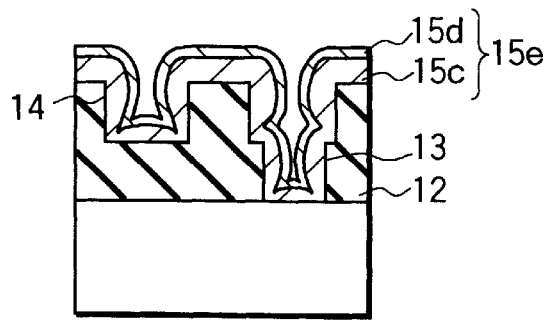
Figure 2C:
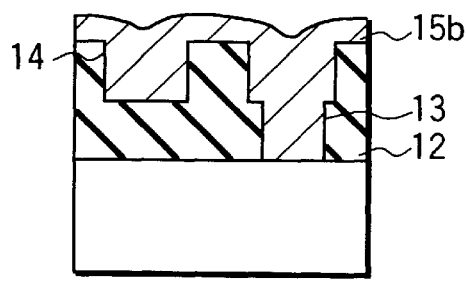
Figure 2D:
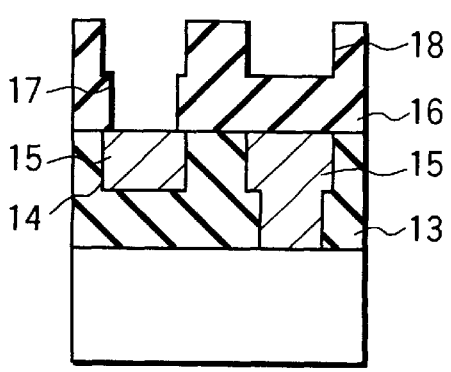
Figure 2E:
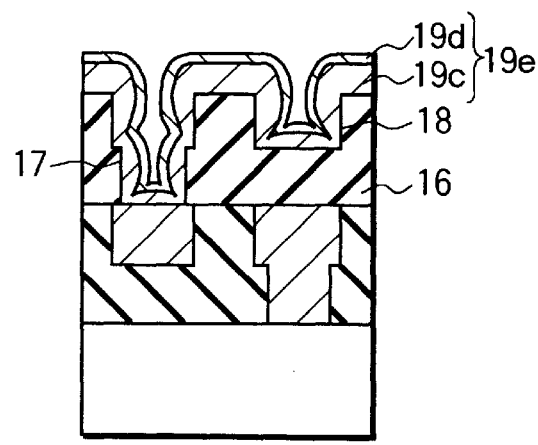
Figure 2F:
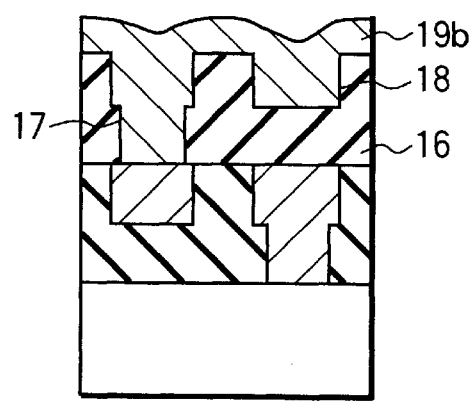
Figure 2G:
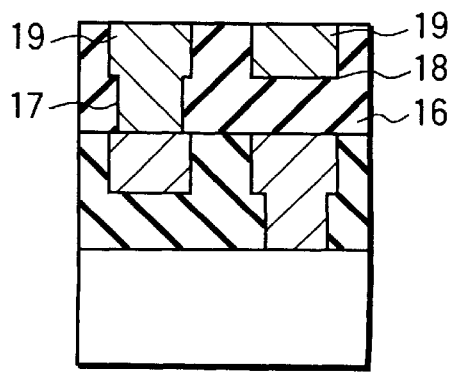

Next, the entire surface of the resultant structure is polished so as to leave the Al—Cu alloy film 19 only in the connection hole 17 and wiring groove 18 and thus a second-level wiring layer is formed (FIG. 1G).

When a third-level wiring layer is further formed, the wiring layer may be formed by the same steps as described above. That is, the third-level wiring layer can be formed by selecting a doping element wherein the eutectic point of the alloy in which the doping element is included is lower than that of the second-level alloy film and setting the film formation temperature (reflow temperature) lower than that set when the second-level alloy film is formed. The same process can be used when a fourth-level or higher-level wiring layer is formed.

As described above, the wiring layers can be formed at temperatures which become gradually lower in a direction from the lower-level side to the higher-level side by changing the type of the doping element used for forming the alloy film in each of the wiring layers and utilizing the difference in the eutectic point.

(Second Embodiment)

Next, a second embodiment of this invention is explained, but since the drawings of FIGS. 1A to 1G can also be used, the explanation is made according to the manufacturing steps shown in the drawings. Further, since some of the manufacturing steps are substantially the same as those explained in the first embodiment, the explanation for these steps is made by referring to the explanation for the corresponding steps in the first embodiment and the detail explanation therefor is omitted.

First, like the first embodiment, a first-level interlaid insulating film 12 is deposited on a silicon substrate 11 and a connection hole 13 and a wiring groove 14 are formed in the interlaid insulating film 12 (FIG. 1A).

Next, a metal alloy film 15b is formed on the interlaid insulating film 12 and in the connection hole 13 and wiring groove 14 by the following two sequential steps. In the second embodiment, aluminum is used as the base metal of the alloy and silicon is used as the doping element.

First, an Al target is placed in the sputtering device, a gas such as $SiH_4$ containing Si is introduced into the sputtering chamber and the reactive sputtering process is effected in a non-heated state to form an Al—Si alloy film 15a with a film thickness of approximately 400 nm (FIG. 1B).

Next, the substrate temperature is set to 500° C. and the reactive sputtering process is effected in the same manner as in the previous step to form an Al—Si alloy film 15b with a total film thickness of approximately 800 nm. Since the sputtering process is effected with the substrate set in the heated state, the Al—Si alloy is set into a fluidized state and the connection hole 13 and wiring groove 14 are completely filled with the Al—Si alloy film 15b (FIG. 1C).

Next, like the first embodiment, the Al—Si alloy film 15 is embedded in the connection hole 13 and wiring groove 14 to form a first-level wiring layer, and then, a second-level interlaid insulating film 16 is deposited on the resultant structure and a connection hole 17 and a wiring groove 18 are formed in the interlaid insulating film 16 (FIG. 1D).

Next, a metal alloy film 19b is formed on the interlaid insulating film 16 and in the connection hole 17 and wiring groove 18 by the following two sequential steps. As the alloy film 19b formed at this stage, a film whose eutectic point is lower than that of the previously formed alloy film 15b is selected. In this embodiment, aluminum is used as the base metal of the alloy and germanium is used as the doping element.

First, an Al target is placed in the sputtering device, a gas such as GeH4 containing Ge is introduced into the sputtering chamber and the reactive sputtering process is effected in a non-heated state to form an Al—Ge alloy film 19a with a film thickness of approximately 400 nm (FIG. 1E).

Then, the substrate temperature is set to 400° C., that is, a temperature which is lower than the substrate temperature 500° C. set in the step of FIG. 1C and the reactive sputtering process is effected in the same manner as in the step of FIG. 1E to form an Al—Ge alloy film 19b with a total film thickness of approximately 800 nm. Since the sputtering process is effected with the substrate set in the heated state, the Al—Ge alloy is set into a fluidized state and the connection hole 17 and wiring groove 18 are completely filled with the Al—Ge alloy film 19b (FIG. 1F).

Next, like the first embodiment, the Al—Ge alloy film 19 is embedded only in the connection hole 17 and wiring groove 18 to form a second-level wiring layer (FIG. 1G).

When a third-level wiring layer is further formed, the wiring layer may be formed by the same steps as described above. That is, the third-level wiring layer can be formed by selecting a doping element wherein the eutectic point of the alloy in which the doping element is included is lower than that of the second-level alloy film and setting the film formation temperature (reflow temperature) lower than that set when the second-level alloy film is formed. The same process can be used when a fourth-level or higher-level wiring layer is formed.

As described above, the wiring layers can be formed at temperatures which become gradually lower in a direction from the lower-level side to the higher-level side by changing the type of the doping element used for forming the alloy film in each of the wiring layers and utilizing the difference in the eutectic point. Further, unlike the first embodiment, in this embodiment, since each of the wiring layers is formed by the reactive sputtering process, it is not necessary to change the sputtering target according to the doping element.

(Third Embodiment)

Next, a third embodiment of this invention is explained, but since the drawings of FIGS. 1A to 1G can also be used, the explanation is made according to the manufacturing steps shown in FIGS. 1A to 1G. Further, since some of the manufacturing steps are substantially the same as those explained in the first embodiment, the explanation for these steps is made by referring to the explanation for the corresponding steps in the first embodiment and the detail explanation therefor is omitted.

First, like the first embodiment, a first-level interlaid insulating film 12 is formed on a silicon substrate 11 and a connection hole 13 and a wiring groove 14 are formed in the interlaid insulating film 12 (step A).

Next, a metal alloy film 15b is formed on the interlaid insulating film 12 and in the connection hole 13 and wiring groove 14 by the following two sequential steps. In the third embodiment, aluminum is used as the base metal of the alloy and gallium is used as the doping element.

First, an Al—Ga (gallium: 5%) alloy film target is placed in the sputtering device and the sputtering process is effected in a non-heated state to form an Al—Ga (gallium: 5%) alloy film 15a with a film thickness of approximately 400 nm (step B).

Next, the substrate temperature is set to 450° C. and the sputtering process is effected by use of the same Al—Ga alloy film target as in the step B to form an Al—Ga alloy film 15b with a total film thickness of approximately 800 nm. Since the sputtering process is effected with the substrate set in the heated state, the Al—Ga alloy is set into a fluidized state and the connection hole 13 and wiring groove 14 are completely filled with the Al—Ga alloy film 15b (step C).

Next, like the first embodiment, the Al—Ga alloy film 15 is embedded in the connection hole 13 and wiring groove 14 to form a first-level wiring layer, and then, a second-level interlaid insulating film,16 is deposited on the resultant structure and a connection hole 17 and a wiring groove 18 are formed in the interlaid insulating film 16 (step D).

Next, a metal alloy film 19b is formed on the interlaid insulating film 16 and in the connection hole 17 and wiring groove 18 by the following two sequential steps. The base metal of the alloy film 19b formed at this stage is Al and the doping element is Ga like the alloy film 15b previously formed, but the concentration of Ga with respect to Al is changed so as to set the eutectic point of the alloy film 19b lower than that of the previously formed alloy film 15b.

First, an Al—Ga (gallium: 10%) alloy film target is placed in the sputtering device and the sputtering process is effected in a non-heated state to form an Al—Ga (gallium: 10%) alloy film 19a with a film thickness of approximately 400 nm (step E).

Then, the substrate temperature is set to 400° C., that is, a temperature which is lower than the substrate temperature 450° C. set in the step C and the sputtering process is effected by use of the same Al—Ga alloy film target as in the step E to form an Al—Ga alloy film 19b with a total film thickness of approximately 800 nm. Since the sputtering process is effected with the substrate set in the heated state, the Al—Ga alloy is set into a fluidized state and the connection hole 17 and wiring groove 18 are completely filled with the Al—Ga alloy film 19b (step F).

Next, like the first embodiment, the Al—Ga alloy film 19 is embedded only in the connection hole 17 and wiring groove 18 to form a second-level wiring layer (step G).

When a third-level wiring layer is further formed, the wiring layer may be formed by the same steps as described above. That is, the third-level wiring layer can be formed by changing the concentration of the doping element to set the eutectic point of the alloy in which the doping element is included lower than that of the second-level alloy film and setting the film formation temperature (reflow temperature) lower than that set when the second-level alloy film is formed. The same process can be used when a fourth-level or higher-level wiring layer is formed.

As described above, the wiring layers can be formed at temperatures which are set gradually lower in a direction from the lower-level side to the higher-level side by changing the concentration of the doping element used for forming the alloy film in each of the wiring layers and utilizing the difference in the eutectic point.

(Fourth Embodiment)

Next, a fourth embodiment of this invention is explained, but since the drawings of FIGS. 1A to 1G can also be used, the explanation is made according to the manufacturing steps shown in FIGS. 1A to 1G. Further, since some of the manufacturing steps are substantially the same as those explained in the first embodiment, the explanation for these steps is made by referring to the explanation for the corresponding steps in the first embodiment and the detail explanation therefor is omitted.

First, like the first embodiment, a first-level interlaid insulating film 12 is formed on a silicon substrate 11 and a connection hole 13 and a wiring groove 14 are formed in the interlaid insulating film 12 (step A).

Next, a metal alloy film 15b is formed on the interlaid insulating film 12 and in the connection hole 13 and wiring groove 14 by the following two sequential steps. In the fourth embodiment, aluminum is used as the base metal of the alloy and germanium is used as the doping element.

First, an Al target is placed in the sputtering device, a gas such as $GeH_4$ containing Ge is introduced into the sputtering chamber and the reactive sputtering process is effected in a non-heated state to form an Al—Ge (germanium: 1%) alloy film 15a with a film thickness of approximately 400 nm (step B).

Then, the substrate temperature is set to 450° C. and the reactive sputtering process is effected in the same manner as in the step B to form an Al—Ge (germanium 1%) alloy film 15b with a total film thickness of approximately 800 nm. Since the sputtering process is effected with the substrate set in the heated state, the Al—Ge alloy is set into a fluidized state and the connection hole 13 and wiring groove 14 are completely filled with the Al—Ge alloy film 15b (step C).

Next, like the first embodiment, the Al—Ge alloy film 15 is embedded in the connection hole 13 and wiring groove 14 to form a first-level wiring layer, and then, a second-level interlaid insulating film 16 is deposited on the resultant structure and a connection hole 17 and a wiring groove 18 are formed in the interlaid insulating film 16 (step D).

Next, a metal alloy film 19b is formed on the interlaid insulating film 16 and in the connection hole 17 and wiring groove 18 by the following two sequential steps. The base metal of the alloy film 19b formed at this stage is Al and the doping element is Ge like the alloy film 15b previously formed, but the concentration of Ge with respect to Al is changed so as to set the eutectic point of the alloy film 19b lower than that of the previously formed alloy film 15b.

First, an Al target is placed in the sputtering device, a gas such as $GeH_4$ containing Ge is introduced into the sputtering chamber and the reactive sputtering process is effected in a non-heated state to form an Al—Ge (germanium: 4%) alloy film 19a with a film thickness of approximately 400 nm (step E).

Then, the substrate temperature is set to 400° C., that is, a temperature which is lower than the substrate temperature 450° C. set in the step C and the sputtering process is effected in the same manner as in the step E to form an Al—Ge (germanium: 4%) alloy film 19b with a total film thickness of approximately 800 nm. Since the sputtering process is effected with the substrate set in the heated state, the Al—Ge alloy is set into a fluidized state and the connection hole 17 and wiring groove 18 are completely filled with the Al—Ge alloy film 19b (step F).

Next, like the first embodiment, the Al—Ge alloy film 19 is embedded only in the connection hole 17 and wiring groove 18 to form a second-level wiring layer (step G).

When a third-level wiring layer is further formed, the wiring layer may be formed by the same steps as described above. That is, the third-level wiring layer can be formed by changing the concentration of the doping element to set the eutectic point of the alloy in which the doping element is included lower than that of the second-level alloy film and setting the film formation temperature (reflow temperature) lower than that set when the second-level alloy film is formed. The same process can be used when a fourth-level or higher-level wiring layer is formed.

As described above, the wiring layers can be formed at temperatures which are set gradually lower in a direction from the lower-level side to the higher-level side by changing the concentration of the doping element used for forming the alloy film in each of the wiring layers and utilizing the difference in the eutectic point. Further, unlike the third embodiment, in this embodiment, since each of the wiring layers is formed by the reactive sputtering process, it is not necessary to change the sputtering target according to the concentration of the doping element.

(Fifth Embodiment)

Next, a fifth embodiment of this invention is explained with reference to the manufacturing process (part of the manufacturing process for an integrated circuit using MOS transistors) shown in FIGS. 2A to 2G. Since some of the manufacturing steps are substantially the same as those explained in the first embodiment, the explanation for these steps is made by referring to the explanation for the corresponding steps in the first embodiment and the detail explanation therefor is omitted.

First, like the first embodiment, a first-level interlaid insulating film 12 is formed on a silicon substrate 11 and a connection hole 13 and a wiring groove 14 are formed in the interlaid insulating film 12 (step A).

Next, a metal alloy film 15b is formed on the interlaid insulating film 12 and in the connection hole 13 and wiring groove 14 by the following two sequential steps. In the fifth embodiment, aluminum is used as the base metal of the alloy and gallium is used as the doping element.

First, an Al target is placed in the sputtering device and the sputtering process is effected in a non-heated state to form an Al film 15c with a film thickness of approximately 400 nm. Then, the sputtering chamber is changed and the sputtering process is effected in a non-heated state to form a Ga film 15d with a film thickness of approximately 16 nm, and thus a laminated film 15e of the Al film 15c and the Ga film 15d is formed (step B).

Next, the substrate temperature is set to 450° C. and the Al sputtering process is effected to form an Al—Ga (gallium: 5%) alloy film 15b with a total film thickness of approximately 800 nm. Since the sputtering process is effected with the substrate set in the heated state, the Al—Ga alloy is set into a fluidized state (that is, the laminated film 15e formed in the step B and Al sputtered in the present step are integrally set into a fluidized state) and the connection hole 13 and wiring groove 14 are completely filled with the Al—Ga alloy film 15b (step C).

Next, like the first embodiment, the Al—Ge alloy film 15 is embedded in the connection hole 13 and wiring groove 14 to form a first-level wiring layer, and then, a second-level interlaid insulating film 16 is deposited on the resultant structure and a connection hole 17 and a wiring groove 18 are formed in the interlaid insulating film 16 (step D).

Next, a metal alloy film 19b is formed on the interlaid insulating film 16 and in the connection hole 17 and wiring groove 18 by the following two sequential steps. The base metal of the alloy film 19b formed at this stage is Al and the doping element is Ga like the alloy film 15b previously formed, but the concentration of Ga with respect to Al is changed so as to set the eutectic point of the alloy film 19b lower than that of the previously formed alloy film 15b.

First, an Al target is placed in the sputtering device and the sputtering process is effected in a non-heated state to form an Al film 19c with a film thickness of approximately 400 nm. Then, the sputtering chamber is changed and the sputtering process is effected in a non-heated state to form a Ga film 19d with a film thickness of approximately 32 nm, and thus a laminated film 19e of the Al film 19c and the Ga film 19d is formed (step E).

Next, the substrate temperature is set to 400° C., that is, a temperature which is lower than the substrate temperature 450° C. set in the step C and the Al sputtering process is effected to form an Al—Ga (gallium: 10%) alloy film 19b with a total film thickness of approximately 800 nm. Since the sputtering process is effected with the substrate set in the heated state, the Al—Ga alloy is set into a fluidized state (that is, the laminated film 19e formed in the step E and Al sputtered in the present step are integrally set into a fluidized state) and the connection hole 17 and wiring groove 18 are completely filled with the Al—Ga alloy film 19b (step F).

Next, like the first embodiment, the Al—Ga alloy film 19 is embedded only in the connection hole 17 and wiring groove 18 to form a second-level wiring layer (step G).

When a third-level wiring layer is formed, the wiring layer may be formed by the same steps as described above. That is, the third-level wiring layer can be formed by changing the concentration of the doping element to set the eutectic point of the alloy in which the doping element is included lower than that of the second-level alloy film and setting the film formation temperature (reflow temperature) lower than that set when the second-level alloy film is formed. The same process can be used when a fourth-level or higher-level wiring layer is formed.

As described above, the wiring layers can be formed at temperatures which are set gradually lower in a direction from the lower-level side to the higher-level side by changing the concentration of the doping element used for forming the alloy film in each of the wiring layers and utilizing the difference in the eutectic point.

(Sixth Embodiment)

Next, a sixth embodiment of this invention is explained with reference to the manufacturing process (part of the manufacturing process for an integrated circuit using MOS transistors) shown in FIGS. 2A to 2G.

First, like the first embodiment, a first-level interlaid insulating film 12 is formed on a silicon substrate 11 and a connection hole 13 and a wiring groove 14 are formed in the interlaid insulating film 12 (step A).

Next, a metal alloy film 15b is formed on the interlaid insulating film 12 and in the connection hole 13 and wiring groove 14 by the following two sequential steps. In the sixth embodiment, aluminum is used as the base metal of the alloy and silicon is used as the doping element.

First, an Al target is placed in the sputtering device and the sputtering process is effected in a non-heated state to form an Al film 15c with a film thickness of approximately 400 nm. Then, the sputtering chamber is changed and the sputtering process is effected in a non-heated state to form a Si film 15d with a film thickness of approximately 16 nm, and thus a laminated film 15e of the Al film 15c and the Si film 15d is formed (step B).

Next, the substrate temperature is set to 500° C. and the Al sputtering process is effected to form an Al—Si alloy film 15b with a total film thickness of approximately 800 nm. Since the sputtering process is effected with the substrate set in the heated state, the Al—Si alloy is set into a fluidized state (that is, the laminated film 15e formed in the step B and Al sputtered in the present step are integrally set into a fluidized state) and the connection hole 13 and wiring groove 14 are completely filled with the Al—Si alloy film 15b (step C).

Next, like the first embodiment, the Al—Si alloy film 15 is embedded in the connection hole 13 and wiring groove 14 to form a first-level wiring layer, and then, a second-level interlaid insulating film 16 is deposited on the resultant structure and a connection hole 17 and a wiring groove 18 are formed in the interlaid insulating film 16 (step D).

Next, a metal alloy film 19b is formed on the interlaid insulating film 16 and in the connection hole 17 and wiring groove 18 by the following two sequential steps. As the alloy film 19b formed at this stage, a film whose eutectic point is lower than that of the previously formed alloy film 15b is selected. In this embodiment, aluminum is used as the base metal of the alloy and germanium is used as the doping element.

First, an Al target is placed in the sputtering device and the sputtering process is effected in a non-heated state to form an Al film 19c with a film thickness of approximately 400 nm. Then, the sputtering chamber is changed and the sputtering process is effected in a non-heated state to form a Ge film 19d with a film thickness of approximately 16 nm, and thus a laminated film 19e of the Al film 19c and the Ge film 19d is formed (step E).

Next, the substrate temperature is set to 400° C., that is, a temperature which is lower than the substrate temperature 500° C. set in the step C and the Al sputtering process is effected to form an Al—Ge alloy film 19b with a total film thickness of approximately 800 nm. Since the sputtering process is effected with the substrate set in the heated state, the Al—Ge alloy is set into a fluidized state (that is, the laminated film 19e formed in the step E and Al sputtered in the present step are integrally set into a fluidized state) and the connection hole 17 and wiring groove 18 are completely filled with the Al—Ge alloy film 19b (step F).

Next, like the first embodiment, the Al—Ge alloy film 19 is embedded only in the connection hole 17 and wiring groove 18 to form a second-level wiring layer (step G).

In the first to sixth embodiments, a case wherein the two-layered wiring structure is formed is explained, but when a third-level wiring layer is further formed, the wiring layer may be formed by the same steps as described above. That is, the third-level wiring layer can be formed by selecting the type of the doping element to set the eutectic point of the alloy in which the doping element is included lower than that of the second-level alloy film and setting the film formation temperature (reflow temperature) lower than that set when the second-level alloy film is formed. The same process can be used when a fourth-level or higher-level wiring layer is formed.

As described above, the wiring layers can be formed at temperatures which are set gradually lower in a direction from the lower-level side to the higher-level side by changing the type of the doping element used for forming the alloy film in each of the wiring layers and utilizing the difference in the eutectic point.

In the first to fourth embodiments, the alloy film 15b and the alloy film 19b are each formed in the two sequential steps of the steps B and C or the steps E and F, but the steps B and E may be omitted and the alloy films 15b and 19b can be formed only by the steps C and F, respectively. However, in this case, in order to attain a favorable embedded state, the detail study on the manufacturing condition is necessary, and a formation method using the two sequential steps can be more favorably used to easily embed the alloy film in the connection hole and wiring groove.

In each of the above embodiments, an aluminum alloy-film is used as the wiring layer, but an alloy film using a metal other than aluminum, for example, copper as the base metal may be used for the wiring layer.

Further, in the first, second and sixth embodiments, the wiring layers are formed at temperatures which are set gradually lower in a direction from the low-level side to the high-level side by changing the type of the doping element, and in the third, fourth and fifth embodiments, the wiring layers are formed at temperatures which are set gradually lower in a direction from the low-level side to the high-level side by changing the concentration of the doping element, but the wiring layers may be formed at temperatures which are set gradually lower in a direction from the low-level side to the high-level side by use of a combination of the above two methods.

Further, in each of the embodiments, the alloy film is formed of two components, but the alloy film may be formed of three or more components. In addition, the alloy film may be formed to contain an element which enhances the reliability of the wiring layer.

Further, in each of the embodiments, all of the wiring layers are formed to contain doping elements, but the lowest-level wiring layer may be formed to contain no doping element and the second-level and higher-level wiring layers may be formed to contain doping elements.

Further, in each of the embodiments, an inorganic insulating material such as a silicon oxide film is used to form each of the interlaid insulating films, but an organic material such as polyimide having low permittivity may be used. Generally, the heat resistance of an organic material is low, but since the wiring layer on the higher-level side can be formed at a relatively low temperature, it is possible to use an organic material of low heat resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:
   a semiconductor substrate having a main surface; and
   a multi-layered wiring layer formed on said main surface of said semiconductor substrate, said multi-layered wiring layer including a plurality of wiring layers insulatively laminated;
   wherein each of said wiring layers constructing said multi-layered wiring layer is formed of the same base metal, and a melting point of each of said plurality of wiring layers is set lower than that of one of said wiring layers which lies at a lower level by introducing at least one doping element into said base metal in at least one of said wiring layers.

2. A semiconductor device according to claim 1, wherein said at least one doping element includes different types of doping elements introduced into said base metal in at least two layers among said wiring layers.

3. A semiconductor device according to claim 1, wherein said at least one doping element includes a doping element introduced at different concentrations into said base metal in at least two layers among said wiring layers.

4. A semiconductor device according to claim 1, wherein each of said plurality of wiring layers is formed in a corresponding one of concave portions formed in a plurality of insulating films laminated on an upper surface side of said semiconductor substrate.

5. A semiconductor device according to claim 1, wherein said base metal is aluminum.

* * * * *